Nov. 19, 1963 L. P. HUNTER 3,111,611

GRADED ENERGY GAP SEMICONDUCTOR DEVICES

Filed Sept. 24, 1957

INVENTOR.
LLOYD P. HUNTER

BY

Alvin J. Riddles
ATTORNEY

United States Patent Office 3,111,611

Patented Nov. 19, 1963

3,111,611
GRADED ENERGY GAP SEMICONDUCTOR DEVICES

Lloyd P. Hunter, Poughkeepsie, N.Y., assignor to International Business Machines Corporation, New York, N.Y., a corporation of New York Filed Sept. 24, 1957, Ser. No. 685,984

21 Claims. (Cl. 317—235)

This invention relates to the fabrication of semiconductor devices and in particular to the advantages obtainable in semiconductor devices through the application of a difference in energy band gap width within the material making up the device.

In the design and fabrication of semiconductor devices, it has been found that a number of features in the performance of such devices may be achieved through the use of a difference in band edge energy level within the body of the device. This difference in band edge energy level may be used to provide regions within the material of the body of the device in which electric fields that may influence minority carrier flow are present so that minority carriers present in the body of the device will tend to flow toward and congregate in one region in preference to others. The result of this situation is that device structures may be then fabricated in which a feature of the semiconductor material may operate to increase the speed of response, the injection efficiency of electrodes applied thereto, the control of capacity associated with such electrodes and a difference in band edge energy level without a corresponding difference in impurity concentration.

A primary object of this invention is to provide a semiconductor body including a difference of energy band gap between one region of the body and another.

Another object is to provide a semiconductor device having a built-in electric field in a non-junction region of the device.

Another object is to provide a low emitter capacity, high emitter breakdown voltage drift transistor.

Still another object is to provide a semiconductor device having a difference in energy band gap appearing at a PN junction.

A related object is to provide a drift transistor having no gradient of impurity concentration in the base region.

Other objects of the invention will be pointed out in the following description and claims and illustrated in the accompanying drawings, which disclose, by way of example, the principle of the invention and the best mode, which has been contemplated, of applying that principle.

Figure 1:
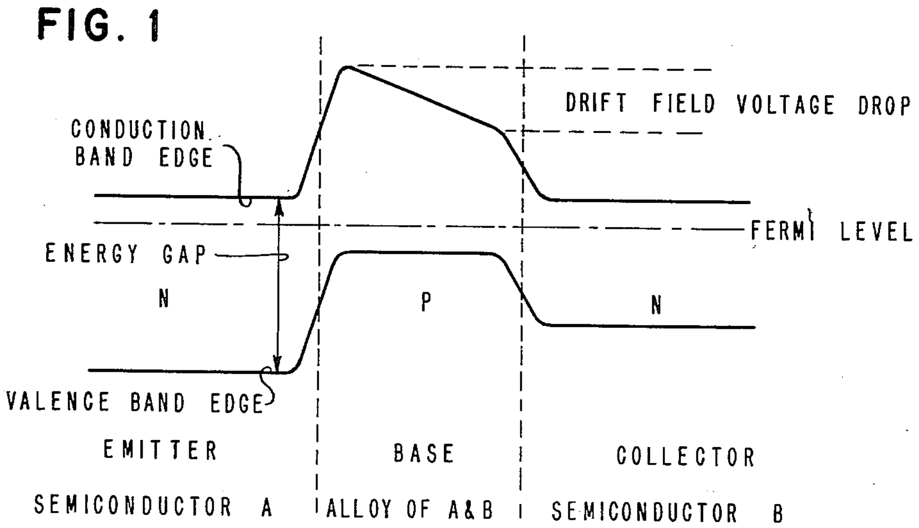
FIG. 1 is an energy level diagram of a semiconductor body illustrating the graded energy band gap of this invention, applied to produce a drift field in the base of a transistor.

The energy band gap in a semiconductor material may be defined as the difference in energy level between the top of the valence band and the bottom of the conduction band of electronic energy levels of the material. The gap between the valence and conduction bands of a particular material is commonly referred to in the art as the "forbidden region"; it represents the minimum quantity of energy necessary to enable an electron to leave the valence band and enter the conduction band. In the region between the valence and the conduction bands of the semiconductor material, an energy level exists known as the "Fermi" level, and this energy level represents the thermal occupation probability of one half. The position of the "Fermi" level, with respect to the conduction band, is a measure of the degree of occupation of the conduction band by conduction electrons and hence determines by its position the electrical conductivity of the material.

In semiconductor devices, a difference in energy band gap width present in the material between one region and another operates to cause a variation of the distance between the conduction and valence bands of the semiconductor material and the "Fermi" level, such that, a lower occupation probability is present in one region of the material. Since the "Fermi" level remains constant throughout a given region of the device, it is clear that the minority carrier band edge must not be at a constant level of energy if the energy band gap is varying in this region. This variation in the level of the band edge represents a built-in electric field urging minority carriers to seek a lower energy level. Since the region of lower band edge energy coincides with the region of higher occupation probability there is, under equilibrium conditions, a minority carrier diffusion current equal and opposite to the electric field current due to the slope of the band edge. Under normal operating bias conditions, the minority carriers are removed from the region of higher occupation probability allowing the minority carriers present in that region of a semiconductor material of a particular device to be acted upon by the internal built-in electric field causing them to drift in the direction of the lower energy level without an opposing diffusion current.

If the difference in energy band gap is placed in a zone having a particular conductivity type, for example, the base of a transistor, with the larger gap near the emitter and the smaller at the collector, an internal, built-in, electric field, such as has been described in the art, in connection with the "Drift" transistor, will be provided. This field will appreciably shorten the transit as well as the storage time of the transistor and enable operation at very high frequency. One example of a "Drift" transistor is described in U.S. Patent 2,810,870. Through the use of the graded energy gap of this invention, it will be apparent that such a "Drift" transistor can be fabricated without the complex problem involved in providing a gradient of impurities in the base region of the "Drift" transistors, known in the art, in order to achieve the proper variation in distance of the "Fermi" level from the minority carrier band edge.

Referring now to FIG. 1, the energy diagram of an NPN junction transistor is shown. The graded energy band gap appears in the base of the transistor and in this illustration, it is shown as being fabricated through the use of two semiconductor materials. In FIG. 1, the emitter region is made of a first semiconductor material, for an example, silicon and the collector region is made of a second semiconductor material, for example, germanium. The base region of the transistor of FIG. 1 is made up of an alloy of the two semiconductor materials with a predominance of semiconductor A (larger energy band gap) in the region adjacent to the emitter and a predominance of semiconductor B (smaller energy band gap) in the region adjacent to the collector. Since semiconductor A has a different energy band gap than semiconductor B, a graded energy band gap will be present in the region between the two materials. The graded energy band gap from the emitter junction to the collector junction is illustrated in the base region of the diagram in FIG. 1 and is labeled "Drift Field Voltage Drop."

When the graded energy band gap of this invention is employed in the base region of a transistor to provide a "Drift" field as is illustrated in FIG. 1, the field so obtained has a greater magnitude and is achieved without introducing as many limitations on the performance of the device as has resulted from the practice heretofore in the art of achieving a "Drift" field by varying the concentration of impurities. The following discussion of a comparison of the technique of this invention with the variation of impurity concentration is included to aid in understanding and practicing the invention and to point out the important effects on performance that subtle differences in the makeup of the body of a semiconductor device will produce.

In a "Drift" transistor, the magnitude of the drift field voltage, when produced through the use of the variation in energy band gap of this invention, may be considerably greater than that found heretofore in the art by the variation of impurity concentration. This greater range of "Drift" field magnitude results because the variation in energy band gap width in semiconductor materials is considerably greater than the magnitude of the difference in band edge energy level in a semiconductor material that can be produced by a variation of impurity concentration. In the case of the variation of impurity concentration, as has heretofore been practiced in the art in providing a "Drift" transistor structure, the absolute value of the voltage drop across the base region is limited to something considerably less than half the energy band gap width of the semiconductor material from which the base region is fabricated. This is because the built-in electric field in the base, of a "Draft" transistor, due to the "Drift" voltage difference, is equal to the difference between the separation of the "Fermi" level from the conduction band on the emitter side of the base and the separation of the "Fermi" level from the conduction band on the collector side of the base.

In "Drift" transistor devices that have been available heretofore in the art, the maximum of the variation of the "Fermi" level has been limited by a combination of fabrication and performance problems. Of these problems, the three having the greatest influence have been the solubility of the impurities introduced into the base region to produce the "Drift" field, the requirement made of the device known as the "emitter breakdown voltage," which is a measure of the physical concentration of the impurities present in the region immediately adjacent to the emitter junction and the requirement made of the device known as "emitter injection efficiency" which also depends on the physical concentration of impurities present on either side of the emitter junction. Considering for a particular example, germanium semiconductor materials, these considerations, in effect, limit the voltage difference across the base region due to the "Drift" field to an approximate maximum value of 0.2 volt and in order to achieve this maximum voltage difference in germanium, it has been found necessary to reduce the parameter, known as the "emitter breakdown voltage" to the order of 1 volt. A further parameter, the "emitter input capacity" of such devices is related to the number of carriers present in the immediate vicinity of the emitter junction and since, for breakdown voltages of this magnitude, the resistivity of the material is low, a large concentration of carriers associated with the impurity centers producing the low resistivity are present. Thus, relatively high, "emitter input capacities" have been associated with these devices. In contrast to this, through the use of the graded energy band gap of this invention to produce a "Drift" field in the base region of a transistor, the "Drift" field in the base is produced through the transition alloy, as is illustrated in FIG. 1, of the semiconductor material A comprising the emitter region and the semiconductor B comprising the collector region so that the variation of energy band gap widths produces the voltage drop across the base region without any gradation of impurity content. As a result, a structure is produced in which the "Drift" field magnitude is independent of the impurity concentration in the base region and therefore allows the control of the "Drift" field without the control also influencing the limitations encountered in the prior art, namely, the "emitter injection efficiency," the "emitter breakdown voltage" and the "emitter input capacity."

Referring again to FIG. 1, on the emitter side, semiconductor A is shown to have a larger energy band gap width than the semiconductor B serving as the collector. The base region of the structure, represented by the energy level diagram, shown in FIG. 1, is shown to coincide with an alloy region combining the semiconductors A and B. This alloy region is constructed containing P type semiconductor impurities while the emitter and collector regions contain N type impurities thus giving an NPN structure. It will be apparent to one skilled in the art that the inverse PNP structure is, of course, equally operable. In the base region, the separation between the "Fermi" level and the edge of the minority carrier band reflects the full difference in the energy band gap width between semiconductor A and semiconductor B. As is shown in the illustration of FIG. 1, through the use of the larger energy band gap width material as the emitter, the built-in "Drift" field thus produced is of proper polarity to aid in the transport of injected minority carriers, electrons in the case of NPN structure illustrated, in their passage from the emitter to the collector through the base region.

In order to further aid in understanding and practicing the invention, the following numerical values of the voltages involved in an illustrative selected embodiment are presented. It being understood, however, that these are not to be construed as limitations since a wide range of such values are available. Considering that for the emitter region of the device illustrated in FIG. 1, silicon semiconductor material is employed as semiconductor A and that for the collector region, germanium semiconductor material is used as semiconductor B. In this case, the difference of energy band gap width is approximately 0.4 electron volt so that a "Drift" transistor produced with these two semiconductor materials, as illustrated in FIG. 1, would have a voltage drop of 0.4 volt across the base region. As previously mentioned, this drop is labeled in FIG. 1 as "Drift Field Voltage Drop."

There is wide difference in energy band gap between different types of semiconductor materials, the popular monoelemental semiconductor materials; silicon and germanium have been described as one embodiment. There is a complete group of semiconductor materials, known in the art as intermetallic compounds, having a very wide range of energy gap widths which are capable of producing even larger energy gap gradients. Some of the available materials are tabulated below in Table I. Of course, all diatomic compounds of elements of group III of the periodic table with elements of group V of the periodic table with the exception of boron nitride (BN) crystallize in the same crystal structure and are therefore mechanically compatible. Since they all have different energy gaps, a large combination of graded energy gap widths are available. It will be apparent that each line of the table represents a class of materials having similar physical properties for purposes of this invention and that combinations of advantageous members of classes may readily be combined by one skilled in the art to provide a device with the desired gap width variation.

*Table I*

| Semiconductor | | Energy Gap Difference (ev.)—Approx. |
|---|---|---|
| A Emitter | B Collector | |
| Si | Ge | 0.40 |
| GaAs | Ge | 0.73 |
| GaAs | InAs | 0.99 |
| GaAs | GaSb | 0.53 |
| $Zn_3As_2$ | $ZnAs_2$ | 0.40 |

As may be seen from the information presented in Table I, it is possible to get much more substantial built-in "Drift" voltages through the application of this invention than is possible through impurity gradients such as has been practiced heretofore in the art.

It will be apparent to one skilled in the art, however, that the advantages of these higher voltages can only be fully realized if the effective mobility of the injected carriers in the base regions of the transistors, such as illustrated in FIG. 1 is comparable to that in impurity gradient "Drift" transistors of the type known heretofore in the art. Considering again, the above described example, the transistor of FIG. 1 wherein semiconductor A is silicon and semiconductor B is germanium. In this illustration, the mobility of electrons in germanium is established to be about 3600 centimeters/second/volt/centimeter. In silicon, it is established that the mobility of electrons is a little less than half of this value so that in a transistor, as illustrated in FIG. 1, in a germanium-silicon alloy base region, the effective transit time across a base region of a given thickness would be only slightly less than the effective transit time across the base of a germanium graded impurity base "Drift" transistor. From the above, it will be apparent that a silicon-germanium graded energy band gap transistor cannot be expected to exceed the speed of a pure germanium "Drift" transistor, but it would have the other recited advantages achieved through relaxation of impurity concentration requirements. In the case of other semiconductor materials, however, considerable speed advantages may be gained. The minority carrier mobilities in indium antimonide (InSb) and gallium antimonide (GaSb) are both higher than in germanium so that the effective transit time in such a device might be an order of magnitude less than the effective transit time in a conventional graded base transistor, such as is currently available in the art, if made from either of these semiconductor materials alone. It will be apparent to one skilled in the art, that a substantial reduction in minority carrier transit time in a semiconductor device is accompanied by a corresponding substantial increase in frequency response provided that the true frequency limitations of the particular semiconductor device is in the transit time of the minority carriers rather than in other factors, such as the capacity of the collector and emitter electrodes. One of the primary virtues of this invention is that the graded energy band gap method of producing a "Drift" transistor allows independent control over the base "Drift" field and eliminates the influence of the "Drift" field on the emitter and collector electrode capacity and the emitter breakdown voltage and injection efficiency.

Figure 2:
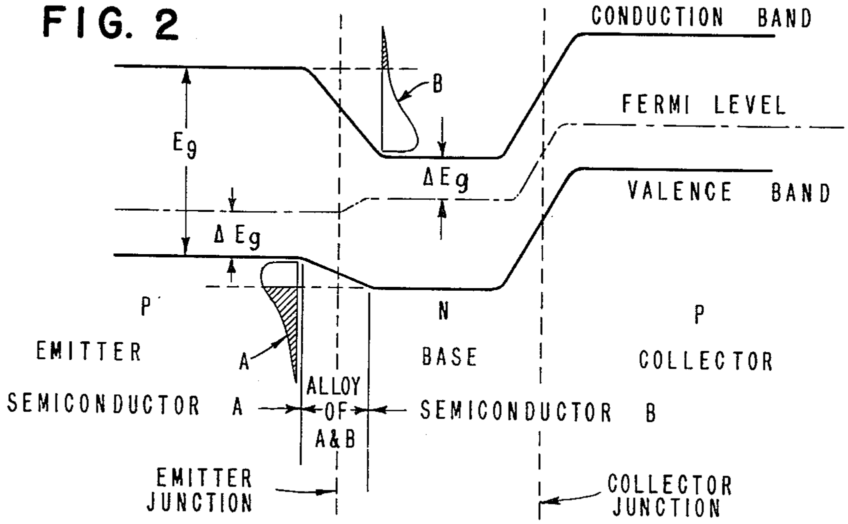
FIG. 2 is an illustration of an energy level diagram illustrating the graded energy band gap of this invention applied to produce a graded emitter junction region in a transistor. The situation is shown with normal electrical bias applied.

Considering next the application of the graded energy band gap of this invention to a semiconductor structure wherein the difference in energy band gap is positioned such as to coincide with a particular junction of the transistor, for example, the emitter junction. Referring now to FIG. 2, an energy level diagram is provided wherein the emitter region of a conventional junction transistor is constructed employing a semiconductor material A having a wide separation between the conduction band and the valence band. The collector and base regions are constructed of semiconductor material B having an energy gap width that is smaller than that of semiconductor material A and a transition region made up of an alloy of semiconductor materials A and B occurs in the structure between the regions labeled emitter and base, in FIG. 2, and, is positioned to coincide with the emitter junction. The manner in which the conductivity type determining impurities are introduced to provide the structure having the band energy levels of FIG. 2 will be described in detail in connection with FIG. 3 to be later described.

Referring now to FIG. 2, the energy level diagram structure illustrates a transistor wherein the graded energy band gap of this invention is employed to achieve the effect of reduction of "emitter input capacity" while maintaining high "emitter injection efficiency." The energy band gap structure of FIG. 2 is drawn to show a normal electrical bias applied, as is commonly done in the art in circuit applications of the PNP type transistor. In the semiconductor structure of FIG. 2, the energy band gap grading is shown as occurring across the emitter junction. The effect of the grading is to produce a non-symmetrical emitter barrier which presents a higher barrier to majority carriers (electrons in this illustration) in the base than to minority carriers (holes in this illustration) in the emitter. The effect of this non-symmetrical barrier is to give high injection efficiency to holes (minority carriers) when the emitter is forward biased. This effect can be understood by noting the relative size of the hole distribution above the emitter barrier, symbolized

and labeled A, to the size of the electron distribution, symbolized

and labeled B, above the same barrier. The portion of the symbol cross hatched is indicative of the distribution magnitude. Since the "Fermi" level in the illustration of FIG. 2 is the same distance ($\Delta E_g$) from the majority carrier band in both the emitter and base region, it will be clear that the impurity concentrations are the same in both the emitter region and the base region. From this, it will be apparent that with low impurity concentration in these regions, since the transition capacity of the connection, in this case the "emitter input capacity" is proportional to the concentration of impurities, low "emitter input capacity" is achieved. At the same time, a high "emitter reverse breakdown voltage" is achieved because a low impurity concentration gives a wide emitter junction depletion region. The above control of transition capacity and breakdown is available through the use of this invention on any injecting or collecting junction to a semiconductor device.

It will further be apparent to one skilled in the art from this structure that it is also possible, of course, to grade the concentration of impurities in the base region and thereby to provide some "Drift" field in that region which will operate to provide an increase in frequency response such as is achieved in conventional "Drift" transistors. Since most present "Drift" transistors are limited by capacity effects, one extremely advantageous use of the variation of energy band gap of this invention is to provide an emitter junction which has at the same time a high injection efficiency and low capacity. One method of providing a transistor having an energy band gap as illustrated in FIG. 2, is shown in FIG. 3.

Figure 3:
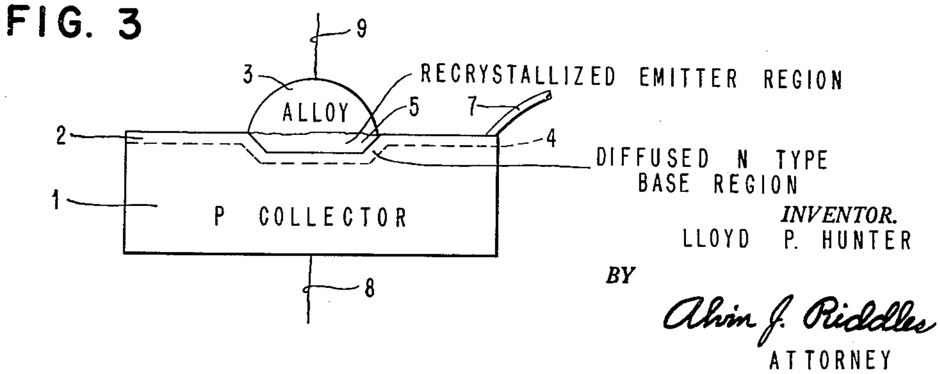
FIG. 3 is an illustration of a transistor structure showing a method of fabricating the graded energy band gap width, illustrated in FIGS. 1 and 2, into a transistor.

Referring now to FIG. 3, considering as a specific example, a P type wafer 1 of germanium semiconductor material, which will serve as semiconductor B is provided. In order to facilitate an external connection to a diffused region to be later described, the wafer 1 is first prepared by introducing, for example, by diffusion, N conductivity type directing impurities into a thin skin upon one surface such as by exposing the surface to an arsenic vapor thereby forming an N conductivity type skin 2. This N type skin 2 will later form a broad area contact to a diffused region which in this illustration may be the base region of a transistor. An alloy is prepared consisting primarily of a carrier material having properties such that is relatively inert with respect to imparting conductivity type to the semiconductor materials used and is capable of dissolving both the semiconductor materials A and B which are to become the emitter region and the collector region of the device. Some examples of useable carrier materials may be lead, tin, gold or silver for use where the semiconductor A is silicon and semiconductor B is germanium. The carrier material of the alloy is saturated at a temperature to be later described with the second semiconductor material A, in this example silicon, thus when fused together semiconductor B (silicon) will have a gap width greater than the semiconductor material A (germanium) of the P type region 1. The alloy further contains traces of conductivity type determining impurities of both N and P type. N type, for example, may be elements of group V of the periodic table and P type, for example, may be elements of group III of the periodic table. These traces are to be provided in the alloy in a relationship such that the N type has a greater diffusion coefficient in semiconductor B than the P type and the P type has a greater product of segregation coefficient and concentration than the N type in an alloy of the alloy and semiconductor B. The diffusion or diffusitivity coefficient is defined as a measure of the ability of one material to penetrate into another. The segregation coefficient is defined as a ratio of concentration of solute in the solid to its concentration in the liquid. A quantity of this alloy is illustrated in FIG. 3 as element 3 and is positioned in contact with the N type skin 2 on a surface of the semiconductor device. The combination is now subjected to heat until the alloy 3 is fused over a small area of the N type surface 2 of the wafer 1 and a certain amount of germanium is dissolved underneath it. At this point, the fused material, which is now a saturated solution of carrier material, semiconductor B and semiconductor A and contains traces of both types of conductivity type determining impurities is maintained at a sufficiently high temperature to permit the N type conductivity type determining impurity to diffuse onto the germanium wafer extending the N type skin region further into the P type region under the alloy 3 thereby forming a graded resistivity base region. An example of an appropriate temperature is about 800° for the materials recited. The formation of the base region as a result of the diffusion is illustrated in FIG. 3 by a dotted line which describes a PN junction 4 between the thin N type region made up of the thin N type skin and the diffused base region and the P type wafer. The PN junction 4 moves out of the plane of the N type skin in the vicinity of and follows the contour of the fused region under the alloy 3.

During the heating period, the P conductivity type directing impurity element will not diffuse appreciably into the germanium since the diffusion coefficient for such elements has been selected to be lower than that of the N conductivity type element. Upon completing the diffusion, the fused region is allowed to cool and a recrystallized semiconductor region 5 will grow epitaxially upon the surface of the germanium wafer. This region has been given the reference numeral 5 for clarity. This recrystallized region 5, due to the selected high product of segregation coefficient and the concentration of the P type impurity will contain a predominance of P conductivity type impurities and it will consist of a transistion region of an alloy of silicon and germanium, such that the alloy will have a major constituent of germanium and a minor constituent of silicon adjacent to the diffused base region and the alloy will have a major constituent of silicon and a minor constituent of germanium adjacent to the alloy 3. With this arrangement a graded gap width occurs varying from the larger value in the germanium to the smaller value in the epitaxial growth where the material is all silicon. The P conductivity type determining impurtiy will predominate over the N as the epitaxial region grows so that the PN junction 6 which is to be the emitter junction of the device falls in the graded gap region.

The control of the gap width grading in the emitter recrystallized region will depend upon the control of germanium and silicon dissolved in the carrier material, in this example, (lead). In order to obtain a recrystallized region which is mechanically compatible with respect to coefficient of expansion relationship with the germanium wafer, it is advantageous to limit the quantity of the alloy to a value that will insure a physically small emitter region. Further, in order to insure a low emitter capacity, it will be advantageous to limit the P conductivity type determining and the N conductivity type determining impurities to relatively low levels. Where such low capacities are desired, one way in which this may be accomplished is to expose the molten lead-silicon alloy to vapors of the P conductivity type and N conductivity type impurity compounds either before or during the fusion of the alloy on the surface of the germanium wafer. Ohmic contacts 7, 8 and 9 may be provided to the N region, the P region and the alloy to provide base, collector and emitter contacts respectively.

What has been described is a technique of providing a difference in the minority carrier band edge energy level within a quantity of a semiconductor which may be used as the body of a semiconductor device. The difference in the minority carrier band edge energy level provides, in the body of a device, an influence on the minority carriers therein which can provide performance advantages. Two illustrations of the influence of this difference in the minority carrier band edge energy level have been selected and illustrated in connection with a conventional junction transistor. The first of these illustrates the effect of the minority carrier band edge energy level difference in a single conductivity type region of a semiconductor body and the second of these indicates the effect when the minority carrier band edge energy level difference is applied across the junction between two regions not of the same conductivity type. From these illustrations, it will be apparent to one skilled in the art that the graded energy band gap of this invention may advantageously be applied for carrier control to the more complex multi-zone and multi-electrode structures becoming available in the art.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A semiconductor device comprising a body of monocrystalline semiconductor material including a first, collector, region having a first energy gap, a second, emitter, region having a second energy gap greater than said first energy gap and a transition, base, region separating said first and said second regions having an energy gap that varies in magnitude with distance from the value of said first energy gap adjacent to said first region to the value of said second energy gap adjacent to said second region and a difference of potential in said body beween said first region and said second region.

2. The semiconductor device body of claim 1 wherein said first region is germanium, said second region is silicon and said transition region is an alloy of silicon and germanium.

3. The semiconductor device body of claim 1 wherein said first region is indium-antimonide, said second region is gallium antimonide and said transition region is an alloy of indium antimonide and gallium antimonide.

4. The semiconductor device body of claim 1 wherein said first region is $ZnAs_2$, said second region is $Zn_3As_2$ and said transition region is a substance in which the ratio of zinc to arsenic intermediate between $Zn_3As_2$ and $ZnAs_2$.

5. A transistor comprising a body of monocrystalline semiconductor material including a first region of a first semiconductor material, said material having a first energy gap and said material including a first zone of a first conductivity type, a second region of a second different semiconductor material, said material having a second energy gap greater than said first energy gap, said second region including a second zone of said first conductivity type, a transition region of an alloy of said first and second semiconductor materials having a graded energy gap that varies in magnitude from said first energy gap adjacent said first semiconductor material to said second energy gap adjacent said second semiconductor material, a third zone of a second conductivity type forming rectifying junctions with each of said first and said second zones and including at least a portion of said transition region and a difference of potential in said body applied across said transition region.

6. The transistor of claim 5 wherein said third zone includes all of said transition region.

7. The transistor of claim 5 wherein one of said rectifying junction is located in said transition region.

8. The transistor of claim 5 wherein said first semiconductor material is germanium and said second semiconductor material is silicon.

9. The transistor of claim 5 wherein said first semiconductor material is indium and antimonide and said second semiconductor material is gallium antimonide.

10. The transistor of claim 5 wherein said first semiconductor material is indium arsenide and said second semiconductor material is gallium arsenide.

11. The transistor of claim 6 wherein said first region is germanium, said second region is silicon and said transition region is an alloy of silicon and germanium.

12. The transistor of claim 6 wherein said first region is indium antimonide, said second region is gallium antimonide and said transition region is an alloy of indium antimonide and gallium antimonide.

13. The transistor of claim 6 wherein said first region is $ZnAs_2$, said second region is $Zn_3As_2$ and said transition region is a substance in which the ratio of zinc to arsenic is intermediate between $ZnAs_2$ and $Zn_3As_2$.

14. The transistor of claim 7 wherein said first region is germanium, said second region is silicon and said transition region is an alloy of silicon and germanium.

15. The transistor of claim 7 wherein said first region is indium antimonide, said second region is gallium antimonide and said transition region is an alloy of indium antimonide and gallium antimonide.

16. The transistor of claim 7 wherein said first region is indium arsenide, said second region is gallium arsenide and said transition region is an alloy of indium arsenide and gallium arsenide.

17. A transistor comprising a body of monocrystalline semi-conductor material including an emitter region having a first energy gap, a collector region having a second energy gap different from said first energy gap, a base region separating said emitter and collector regions and having an energy gap that varies in magnitude with the distance from the value of said first energy gap adjacent said emitter region to the value of said collector energy gap adjacent said second region and a difference of potential in said body between said emitter region and said collector region.

18. The transistor of claim 17 wherein said emitter region is silicon, said collector region is germanium and said base region is an alloy of silicon and germanium.

19. The transistor of claim 17 wherein said collector region is indium antimonide, said emitter region is gallium antimonide and said base region is an alloy of indium antimonide and gallium antimonide.

20. The transistor of claim 17 wherein said emitter region is $Zn_3As_2$, said collector region is $ZnAs_2$ and said base region is a substance wherein the ratio of zinc to arsenic is intermediate between $Zn_3As_2$ and $ZnAs_2$.

21. A transistor comprising a body of monocrystalline semi-conductor material including an emitter region having a first energy gap, a collector region having a second energy gap different from said first energy gap, a base region separating said emitter and collector regions and having an energy gap that varies in magnitude with the distance from the value of said first energy gap adjacent said emitter region to the value of said collector energy gap adjacent said second region and means for applying a difference of potential in said body between said first and second regions.

References Cited in the file of this patent

UNITED STATES PATENTS

| | | |
|---|---|---|
| 2,798,989 | Welker | July 9, 1957 |
| 2,822,307 | Kopelman | Feb. 4, 1958 |
| 2,836,521 | Longini | May 27, 1958 |
| 2,843,511 | Pankove | July 15, 1958 |
| 2,847,335 | Gremmelmaier et al. | Aug. 12, 1958 |
| 2,850,688 | Silvey | Sept. 2, 1958 |
| 2,861,018 | Fuller et al. | Nov. 18, 1958 |
| 2,862,840 | Kordalewski | Dec. 2, 1958 |
| 2,869,055 | Noyce | Jan. 13, 1959 |

FOREIGN PATENTS

| | | |
|---|---|---|
| 751,408 | Great Britain | June 27, 1956 |
| 1,137,399 | France | Jan. 14, 1957 |